(12) United States Patent
Carcasi et al.

(10) Patent No.: US 11,061,332 B2
(45) Date of Patent: Jul. 13, 2021

(54) METHODS FOR SENSITIZING PHOTORESIST USING FLOOD EXPOSURES

(71) Applicant: Tokyo Electron Limited, Tokyo (JP)

(72) Inventors: Michael A. Carcasi, Austin, TX (US); Mark H. Somervell, Austin, TX (US); Seiji Nagahara, Kanagawa (JP)

(73) Assignee: Tokyo Electron Limited, Tokyo (JP)

( * ) Notice: Subject to any disclaimer, the term of this patent is extended or adjusted under 35 U.S.C. 154(b) by 260 days.

(21) Appl. No.: 16/136,688

(22) Filed: Sep. 20, 2018

(65) Prior Publication Data

US 2019/0094698 A1 Mar. 28, 2019

Related U.S. Application Data

(60) Provisional application No. 62/562,187, filed on Sep. 22, 2017.

(51) Int. Cl.
| | | |
|---|---|---|
| *G03F 7/20* | (2006.01) | |
| *G03F 7/40* | (2006.01) | |
| *G03F 7/004* | (2006.01) | |
| *G03F 7/09* | (2006.01) | |

(52) U.S. Cl.
CPC .......... *G03F 7/2022* (2013.01); *G03F 7/0045* (2013.01); *G03F 7/091* (2013.01); *G03F 7/40* (2013.01); *G03F 7/70033* (2013.01)

(58) Field of Classification Search
CPC ...... G03F 7/2022; G03F 7/0045; G03F 7/091; G03F 7/40; G03F 7/70033
USPC .......................................... 430/30, 313, 328
See application file for complete search history.

(56) References Cited

U.S. PATENT DOCUMENTS

| | | |
|---|---|---|
| 10,020,195 B2 | 7/2018 | Scheer et al. |
| 2008/0076058 A1 | 3/2008 | Leeson et al. |

OTHER PUBLICATIONS

Chauhan, "Modeling and Defect Analysis of Step and Flash Imprint Lithography and Photolithography", PhD dissertation, The University of Texas Austin, Aug. 2010, 219 pages.
Sarma et al., "Simulation-assisted layout biasing in EUV lithography and prediction of an optimum resist parameter space", Proceedings of SPIE, vol. 8679, 2013, 7 pages.
Smith et al., "Optimization of a virtual EUV photoresist for the trade-off between throughput and CDU", Proceedings of SPIE, vol. 8682, 2013, 12 pages.
Nagahara Seiji et al: Challenge toward breakage of RLS trade-off for EUV lithography by Photosensitized Chemically Amplified Resist (PSCAR) with Flood Exposure:, Proceedings of SPIE; [Proceedings of SPIE ISSN 0277-786X vol. 10524], SPIE, US, vol. 9776, Mar. 18, 2016 (Mar. 18, 2016), pp. 977607-977607, XP060067540, DOI: 10.1117/12.2219433 ISBN: 978-1-5106-1533-5.
PCT Office, Search Report and Written Opinion issued in PCT/US2018/051988 dated Jan. 17, 2019, 13 pages.
PCT Office, International Preliminary Report on Patentability issued in PCT/US2018/051988 dated Mar. 24, 2020, 7 pages.

*Primary Examiner* — Christopher G Young
(74) *Attorney, Agent, or Firm* — Wood Herron & Evans LLP

(57) ABSTRACT

A patterning method is provided in which a light-sensitive layer is formed, and a target resolution is defined for a pattern to be formed in a target layer. Based on a reference dose and reference LWR that results from a single patterning exposure at an EUV wavelength, the target resolution and reference dose, the light-sensitive layer is subjected to at least two radiation exposures including an EUV patterning exposure at a dose selected to be less than the reference dose and within 15 mJ/cm$^2$-200 mJ/cm$^2$, and a flood exposure at a wavelength of 200 nm-420 nm and a dose of 0.5 J/cm$^2$-20 J/cm$^2$. The light-sensitive layer is then developed to form a mask pattern, which is used to etch the pattern into the target layer with the target resolution and a LWR less than or approximately equal to the reference LWR and ≤5 nm.

22 Claims, 2 Drawing Sheets

METHODS FOR SENSITIZING PHOTORESIST USING FLOOD EXPOSURES

FIELD OF INVENTION

The invention relates to methods for patterning a target layer on a substrate, and more particularly to a method for reducing resist sensitivity while maintaining or improving line width roughness and resolution.

BACKGROUND OF THE INVENTION

In material processing methodologies, pattern etching comprises the application of a layer of light-sensitive (or radiation-sensitive) material, such as photoresist (or "resist" for short), to an upper surface of a substrate, the formation of a pattern in the resist layer using photolithography, and the transfer of the pattern formed in the resist layer to an underlying target layer (thin film) on the substrate using an etching process. The patterning of the resist generally involves exposure of the resist to a pattern of electromagnetic (EM) radiation using, for example, a photolithography system, followed by the removal of the irradiated regions of the resist (as in the case of positive tone resist), or non-irradiated regions (as in the case of negative tone resist) using a developing solution.

Critical dimension (CD) control for photolithography patterning is important for semiconductor device manufacturing. As the critical dimension (CD) decreases, there is a need to improve the resolution of the pattern of EM radiation (Resolution) and the sensitivity of the resist (Sensitivity) while keeping the line width roughness (LWR) of the resulting pattern within acceptable limits. It is known in the art that there is a trade-off relationship between Resolution, LWR, and Sensitivity (dose), often called the RLS (or LRS) trade-off triangle or relationship. The RLS trade-off triangle states that you cannot simultaneously lower resolution, roughness and sensitivity in a material platform. Conventional techniques that seek to improve one of the three parameters often improve at the unacceptable expense of one or both of the other parameters.

Extreme ultra violet (EUV) lithography shows promising results for feature sizes below 40 nm. However, EUV resist sensitivity (EUV dose) is one of the challenges for EUV lithography. As CDs scale to smaller dimensions, patterning processes that incorporate smaller wavelengths of light (e.g., EUV) may not have as many photons as the larger light wavelengths. EUV photons (92 eV) are ~15× as energetic as 193 nm photons, so for the same exposure dose there are fewer photons. With fewer photons, significantly less acid is created (which in the case of EUV is primarily via a secondary electron photo-acid generator (PAG) decomposition event). As a result, the amount of acid generated within an EUV resist at a manufacturing-friendly dose is typically lower than what is typically observed in standard DUV (i.e., 193 nm and 248 nm) chemically amplified photoresist systems. Standard means of increasing the resist sensitivity (such as by increasing the PAG concentration) have not proven beneficial in EUV systems because they reduce the number of photons required to achieve a certain line width and so increase shot-noise related LWR in the resist patterns. For this reason, researchers have considered adding many kinds of photosensitizer element and/or other light-absorbing elements such as chromophores to achieve a RLS trade-off balance. Such endeavors have led to the development on PS-CAR chemistries.

Another challenge with EUV processing is getting the EUV scanner's source power high enough to account for this lower photon creation for equivalent dose to 193 nm exposure. Raising the EUV exposure dose increases the number of photons, lowers throughput and increases operating cost. To achieve the goal of high-volume manufacturing, also referred to as enabling throughput, the photo-lithography tool should achieve about 100 wafers per hour or higher. The throughput of the photolithography tool is a function of the EUV energy, so for a higher EUV dose, fewer substrates are processed per hour. Thus, to implement EUV processing, not only must the RLS trade-off triangle be overcome or significantly minimized, but the process must provide an enabling throughput for high volume manufacturing. Many researchers have tried to escape the RLS triangle and throughput challenges, but as of yet none have fully succeeded. There is thus a continuing need for patterning methods that allow reduction of resist sensitivity without negative impact to the LWR and resolution and that achieve an enabling throughput for EUV lithography.

SUMMARY

In accordance with an embodiment of the present disclosure, a light-sensitive layer is formed on the substrate and a target resolution is defined for the pattern to be formed in a target layer on the substrate. Based on a reference dose and based on a reference line width roughness for the pattern that would result from a single patterning exposure using energy at a wavelength between 13 nm and 15 nm at the target resolution and reference dose, the light-sensitive layer is subjected to at least two exposures of radiative energy. The at least two exposures include a patterning exposure comprising the energy at the wavelength between 13 nm and 15 nm and a dose selected to be less than the reference dose and in a range of 15 mJ/cm$^2$ and 200 mJ/cm$^2$, and a flood exposure comprising energy at a wavelength between 200 nm and 420 nm and a dose between 0.5 J/cm$^2$ and 20 J/cm$^2$. In one embodiment, the flood exposure comprises energy at a wavelength between 360 nm and 400 nm. The light-sensitive layer is then developed to form a mask pattern in the light-sensitive layer, and the substrate is etched using the mask pattern to form the pattern in the target layer on the substrate. The resulting pattern has the target resolution and a line width roughness that is less than or approximately equal to the reference line width roughness and less than or equal to 5 nm. By this method, an enabling throughput can be achieved with a decrease in EUV sensitivity and the same or better LWR and resolution, thereby overcoming the RLS triangle.

In accordance with another embodiment of the present disclosure, a chemically-amplified resist (CAR) layer is formed on the substrate, wherein the CAR layer comprises a photo-acid generator (PAG), a photo-decomposable base (PDB), or both, and is free of addition of photosensitizer elements, and a target resolution is defined for the pattern to be formed in a target layer on the substrate. Based on a reference dose and based on a reference line width roughness for the pattern that would result from a single patterning exposure using energy at a wavelength between 13 nm and 15 nm at the target resolution and reference dose, the CAR layer is subjected to at least two exposures of radiative energy. The at least two exposures include a patterning exposure comprising the energy at the wavelength between 13 nm and 15 nm and a dose selected to be at least 3 mJ/cm$^2$ less than the reference dose and in a range of 20 mJ/cm$^2$ and 75 mJ/cm$^2$, and thereafter, a flood exposure comprising energy at a wavelength between 360 nm and 400 nm and a dose between 2 J/cm$^2$ and 12 J/cm$^2$. The CAR layer is then developed to form a mask pattern in the CAR layer and the substrate is etched using the mask pattern to form the pattern in the target layer on the substrate. The resulting pattern has the target resolution and a line width roughness that is at least 0.1 nm less than the reference line width roughness and less than or equal to 5 nm.

DETAILED DESCRIPTION

Figure 1:
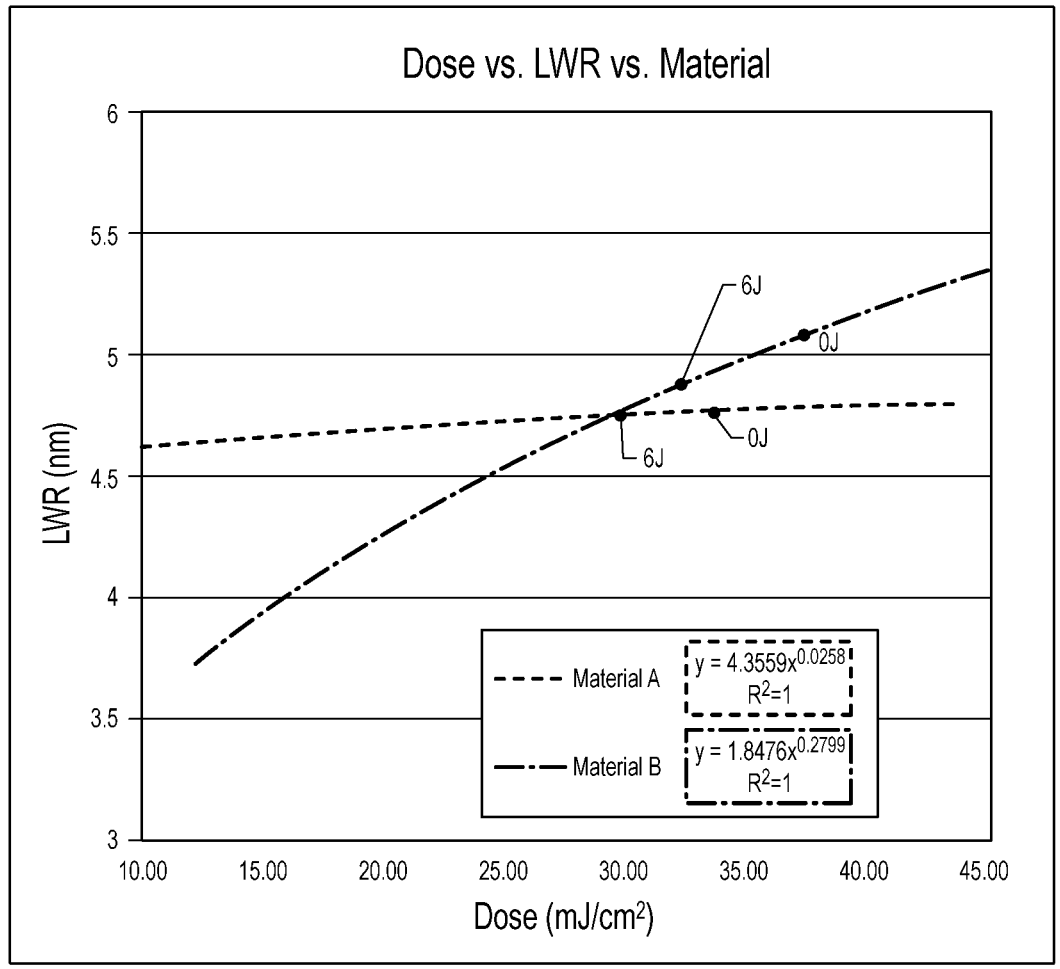
FIG. 1 is a graph of the LWR and EUV dose for two different resists used in EUV processing, both without a flood exposure and with a flood exposure following the EUV patterning exposure.

A method for patterning a substrate is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details.

Reference throughout this specification to "one embodiment" or "an embodiment" or variation thereof means that a particular feature, structure, material, or characteristic described in connection with the embodiment is included in at least one embodiment of the invention but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Nonetheless, it should be appreciated that contained within the description are features that, notwithstanding the inventive nature of the general concepts being explained, are also of an inventive nature.

"Substrate" as used herein generically refers to the object being processed in accordance with embodiments of the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

In this application, the terms dose and energy are used interchangeably to mean the EUV radiation used to irradiate the light-sensitive material. Any suitable light-sensitive material for EUV patterning exposure may be used, and reference to photoresist is intended to be exemplary and not limiting. Furthermore, resist and photoresist are used interchangeably to mean photoresist.

Disclosed herein are techniques to enable using a lower EUV dose in resist patterning while maintaining or improving roughness and resolution, thus breaking the RLS triangle. Ordinarily, under the proposed EUV dose regime disclosed herein, the LWR for EUV imaged patterns would be too high to support high volume manufacturing. In accordance with this disclosure, in one embodiment, the lower EUV dose regime is enabled by a mid-UV flood exposure system for a traditional CAR flow (or other EUV resist material) either before EUV patterning, after EUV patterning, or the combination thereof. The addition of the mid-UV flood exposure enables preferential additional photochemistry within the resist, which enables the unexpectedly low LWR result for an EUV dose regime that in the past did not achieve the desired electrical performance and/or patterning quality. Other benefits of the low EUV dose regime are increased throughput and lower operating cost for EUV systems, which are required for high volume manufacturing. In addition, quite surprisingly, the use of a photosensitizer (PS) is not necessary to try and achieve a trade-off balance in the RLS triangle relationship, as the present method breaks the RLS triangle, thereby overcoming the need to trade-off one aspect to improve another aspect, for example trade-off LWR and/or resolution to improve sensitivity.

One approach to break the RLS triangle, in accordance with the present disclosure, for CAR or other EUV patterning materials includes use of a high power mid-UV flood exposure system in addition to an EUV patterning exposure. The light-sensitive material (resist) is thus subjected to at least two exposures of radiative energy, including a patterning exposure with energy at a wavelength between 13 nm and 15 nm and a dose between 15 mJ/cm$^2$ and 200 mJ/cm$^2$, which may be referred to as the EUV patterning exposure, and a flood (or blanket) exposure with energy at a wavelength between 200 nm and 420 nm and a dose between 0.5 J/cm$^2$ and 20 J/cm$^2$. In one embodiment, the flood exposure uses energy at a wavelength greater than 360 nm, or between 360 nm and 400 nm. In one exemplary example, a 365 nm>1 J/cm$^2$ exposure system is proposed, but the ideal wavelength and dose may depend on the absorption properties of a given resist material. This flood exposure system can be used either before the EUV patterning exposure ( . . . →COT→PAB→mid-UV flood→EUV→PEB→DEV), after EUV patterning exposure ( . . . →COT→PAB→EUV→mid-UV flood→PEB→DEV), or the combination thereof ( . . . →COT→PAB→mid-UV flood→EUV→mid-UV flood→PEB→DEV) (where COT=resist coater, PAB=post-apply bake, mid-UV flood=flood exposure, EUV=EUV patterning exposure, PEB=post-exposure bake, and DEV=develop). This disclosure describes methods to enable lower EUV dose during patterning and maintaining or improving roughness and resolution, as compared to the dose, resolution and roughness achievable in a single exposure patterning process using a single EUV patterning exposure and no flood exposure. In one embodiment, a high power mid-UV flood exposure system may be used to treat the substrate to initiate advantageous alternative chemical reactions within the EUV resist matrix.

Figure 2:
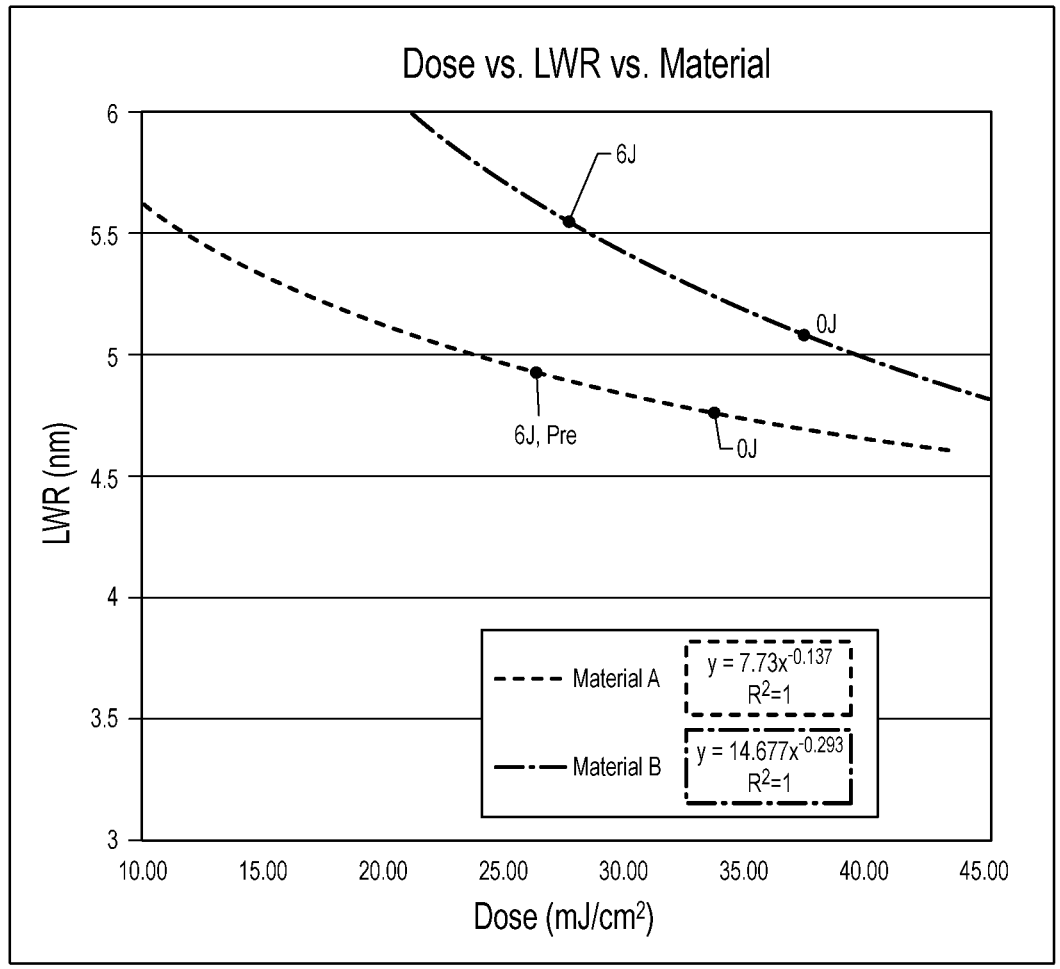
FIG. 2 is a graph of the LWR and EUV dose for two different resists used in EUV processing, both without a flood exposure and with a flood exposure preceding the EUV patterning exposure.

FIGS. 1 and 2 illustrate data comparing the LWR (y-axis) and EUV dose (x-axis) with at least two different types of resist used in EUV processing, as will be discussed in more detail below. In these results, a clear reduction of the dose and roughness can be achieved while maintaining imaging at a near optical resolution limit of 16 nm line/space and with a comparable exposure latitude response. In the past, the RLS dilemma was conceptualized around the observed phenomena where LWR always increased with decreasing dose, while maintaining the same resolution. To achieve desired electrical results, the EUV dose had to be increased to improve LWR to obtain desired electrical device and patterning performance. However, that approach decreased throughput and increased manufacturing cost. Before the present disclosure, this inverse relationship had not been shown to be broken, nor had it been shown that a decrease in EUV dose while maintaining the same resolution could also maintain or decrease LWR instead of increasing LWR.

The EUV patterning process flow may include a chemically-amplified resist (CAR) or other light-sensitive materials used to form patterns on a semiconductor substrate. The resist may include a photo-acid generator (PAG), a photo-decomposable base (PDB), or both, as the chemical amplification means. In some embodiments, the resist is free of addition of photosensitizer elements and/or light absorbing elements such as chromophores. The process flow may include one or more layers disposed between the resist and the substrate for limiting reflections during EUV processing or forming hard-masks to be used during subsequent processing. In one embodiment, one or more anti-reflective coating (ARC) layers are formed on the substrate with the resist layer formed thereon, where an absorption layer is included that is tuned to absorb light at the wavelength of the flood exposure. In one embodiment, a spin-on-carbon (SOC) layer is formed on the substrate, a spin-on-glass (SOG) layer is formed on the SOC layer, and the resist is formed on the SOG layer, and the SOC layer is configured to limit reflections of radiative energy from the substrate at the wavelength of the flood exposure.

Generally, the EUV pattering process may include, but is not limited to, coating the substrate with the resist, pre-exposure treatment, EUV patterning exposure, post-exposure treatment, and developing the resist to form a pattern within the resist that may expose material underlying the resist. The pre-exposure treatments may include baking the resist and/or exposing the resist to a radiative energy. In one embodiment, the baking may be accomplished using a hot plate that transfers thermal energy to the substrate when the substrate is placed on the hot plate. Radiative energy may be applied to the substrate via a radiative energy source that emits light or energy at a particular wavelength and dose. The radiative energy source may be a flood or blanket treatment across the entire resist layer. In one embodiment, the radiative energy may include a wavelength between 200 nm and 420 nm. In another embodiment, the wavelength may be limited between 300 nm and 400 nm, or between 360 nm and 400 nm, or greater than 360 nm. In one specific embodiment, the wavelength may be about 365 nm. In another specific embodiment, the wavelength may be about 395 nm. The radiative energy source may also be designed to enable an energy dose between 0.5 $J/cm^2$ and 20 $J/cm^2$. However, in some embodiments, the energy dose may be less than 12 $J/cm^2$ or less than 10 $J/cm^2$ to enable the EUV process to use a lower dose without increasing LWR. For example, the energy dose may be between 2 $J/cm^2$ and 12 $J/cm^2$ or between 3 $J/cm^2$ and 9 $J/cm^2$. In one specific embodiment, the radiative energy dose may be about 6 $J/cm^2$.

Following the pre-treatment, the substrate is subjected to a patterning exposure by treating the resist with EUV energy or light having a wavelength between 13 nm and 15 nm with a dose between 15 $mJ/cm^2$ and 200 $mJ/cm^2$. However, in another embodiment, the EUV dose may be between 20 $mJ/cm^2$ and 75 $mJ/cm^2$. The post-exposure treatments may include baking the resist and/or exposing the resist to a radiative energy. In one embodiment, the post exposure baking may be accomplished using a hot plate that transfers thermal energy to the substrate when the substrate is placed on the hot plate. Radiative energy may be applied to the substrate via a radiative energy source that emits light or energy at a particular wavelength and dose. The radiative energy source may be a flood or blanket treatment across the entire resist layer and may be implemented by a UV-light system (e.g., lamps or LEDs) designed to emit light at desired wavelengths and doses. In one embodiment, the radiative energy may include a wavelength between 200 nm and 420 nm. In another embodiment, the wavelength may be limited between 300 nm and 400 nm, or between 360 nm and 400 nm, or greater than 360 nm. In one specific embodiment, the wavelength may be about 365 nm. In another specific embodiment, the wavelength may be about 395 nm. The radiative energy source may also be designed to enable an energy dose between 0.5 $J/cm^2$ and 20 $J/cm^2$. However, in some embodiments, the energy dose may be less than 12 $J/cm^2$ or less than 10 $J/cm^2$ to enable the EUV process to use a lower dose without increasing LWR. For example, the energy dose may be between 2 $J/cm^2$ and 12 $J/cm^2$ or between 3 $J/cm^2$ and 9 $J/cm^2$. In one specific embodiment, the radiative energy dose may be about 6 $J/cm^2$. In some embodiments, the radiative energy process conditions during the post-exposure treatment are not required to be the same as those used in the pre-exposure treatment. For example, one of the pre-exposure treatment or the post-exposure treatment is conducted at a wavelength between 200 nm and 420 nm, for example greater than 360 nm, and an energy dose between 0.5 $J/cm^2$ and 20 $J/cm^2$ while the other of the pre-exposure treatment or the post-exposure treatment is conducted at a wavelength and/or energy that may fall outside these recited ranges. However, advantageously, where both a pre-exposure treatment and a post-exposure treatment are conducted, they each fall within the recited ranges, but may be the same or different than each other.

After the post-exposure treatment, a development treatment may be used to form a mask pattern within the resist. Subsequently, the mask pattern may be used to etch one or more underlying layers to form a pattern within a target layer on the substrate. In one embodiment, the LWR for the pattern may be less than 5 nm. In one embodiment, a reduction in the LWR of at least 0.1 nm can be achieved at an EUV patterning dose that is at least 3 $mJ/cm^2$ less, as compared to an EUV patterning process using a single exposure at the same EUV wavelength and resolution.

As described above, both the pre-exposure and post-exposure treatments may include exposing the resist to the radiative energy. In another embodiment, the pre-exposure treatment includes the radiative energy process, but the post-exposure treatment does not include the radiative process, such that the radiative energy source is only used before the EUV patterning process. However, in another embodiment, the pre-exposure treatment does not include the radiative energy process, but the post-exposure treatment does include the radiative process, such that the radiative energy source is only used after the EUV process.

Turning to FIG. 1, the experimental results show the methods disclosed herein can enable a lower EUV dose than would ordinarily be used during patterning. FIG. 1 illustrates experimental results for two materials in which an inline 6 $J/cm^2$ 365 nm flood exposure was performed after the EUV patterning exposure. FIG. 1 illustrates the relationship between EUV dose and LWR when a post-exposure UV flood treatment is added to the process ("6 J") versus no UV flood treatment ("0 J"). As shown in FIG. 1, the post-exposure treatment enables a decrease in LWR when the EUV dose is lowered, which is unexpected given the RLS triangle relationship described above. The experiment included two different materials, Materials A and B, being representative of EUV resists that would be used by persons of ordinary skill in the art of EUV processing. The two materials contain similar acid quenching molecules that may be opaque to the light between 200 nm and 420 nm, and particularly to light greater than 360 nm, for example, 360 nm-400 nm. In one specific embodiment, the acid quenching molecules are opaque to light with a wavelength of about 365 nm. Material B showed a marked reduction in LWR, from above 5 nm to less than 5 nm, despite a decrease in the EUV dose of about 5 $mJ/cm^2$. Material A showed a slight decrease in LWR, maintaining the LWR below 5 nm, despite a decrease in the EUV dose of about 3-4 $mJ/cm^2$. Thus, based on the 0 J process as a reference process in which a single exposure to EUV radiation at a reference dose is conducted for a target pattern resolution and a resulting reference LWR is obtained, the present method may be performed where the same EUV patterning exposure wavelength and target resolution are selected and the EUV dose for the patterning exposure is selected to be less than the reference dose, the method further including a flood exposure with energy at a wavelength between 200 nm and 420 nm, for example greater than 360 nm, and a dose between 0.5 $J/cm^2$ and 20 $J/cm^2$, where the resulting pattern etched into a target layer has the target resolution and a LWR that is less than the reference LWR and less than or equal to 5 nm.

FIG. 2 illustrates experimental results for the same two materials in which an inline 6 $J/cm^2$ 365 nm flood exposure was performed before the EUV patterning exposure. In FIG. 2, the classic RLS trade-off relationship is only slightly seen when doing a pre-exposure only UV-light treatment of the resist. However, the slight increase in LWR is much lower than would be expected under the classic RLS trade-off relationship and opens the possibility of getting some level of sensitization benefit from the use of a mid-UV flood exposure system before the EUV patterning exposure. Material A, for example, only experienced an increase in LWR of less than 0.2 nm and still achieved a LWR less than 5 nm despite lowering the EUV dose by 7-8 $mJ/cm^2$. If the dose was only decreased by 5-6 $mJ/cm^2$, the LWR could be maintained within 0.1 nm. Achieving a LWR that is approximately equal to (e.g., +/−0.1 nm) the reference LWR for a lower EUV dose is an unexpected break in the RLS triangle relationship that is known to dictate a marked increase in the LWR. FIGS. 1 and 2 provide strong evidence of an unexpected result given the well-known RLS trade-off relationship wherein LWR and EUV dose are inversely related when resolution remains constant. It's been demonstrated that a high power mid-UV flood exposure system can be used to get advantageous alternative chemical reactions happening within the EUV resist matrix that ultimately lead to enabling a lower EUV dose while maintaining or improving roughness and resolution, and most particularly when the flood exposure is performed following the EUV patterning exposure. Additionally, it is further surprising that this result can be achieved without PS and/or other light-absorbing elements such as chromophores in the resist chemistry.

As demonstrated above, the RLS trade-off relationship may be overcome for different types of EUV resist using a high power mid-UV flood exposure system, but the ideal wavelength and dose may vary between different resists and may likely depend on the absorption properties of a given material. Thus, for improved EUV resist sensitization at a given resolution, the wavelength and dose may need to be optimized to drive the EUV dose lower without increasing LWR by more than 0.1 nm and even with a decrease in the LWR, and achieving an LWR that is at or below a target value. For example, for a given resolution, a target maximum for LWR may be identified, such as 5 nm, and the wavelength and lowest dose achievable may be determined to meet that target. In one embodiment, the wavelength and dose are selected to obtain a greater than 0.1 nm reduction in LWR with a decrease in dose of at least 3 $mJ/cm^2$, as compared to a reference single patterning exposure process.

The generation of acid during exposure requires coordination between two stochastic processes—the resist absorbs photons and the energy from the photons is transferred to a photo-acid generator (PAG) (or derivatives) or a photo-decomposable base (PDB) (or derivatives). For EUV patterning exposure, the energy transfer can occur by direct absorption or by interaction with a photoelectron. In one embodiment, the high power mid-UV flood system or module (secondary wavelength) is used and optimized to obtain photoelectron interactions and/or direct photon absorption events ("interaction/absorption events") within the resist material itself. The interaction/absorption events can lead to several possible outcomes. One outcome is the exchange of electrons that help with further PAG decomposition or PDB decomposition. PAG or PDB decomposition leads to potentially higher acid loading or lower base loading or the combination thereof. This ability to shift the loading of either, or both, of these can lead to an optimum concentration, profile, or threshold being established at the target feature edge within the imaged resist, improving roughness as compared to just EUV patterning exposure.

Another outcome of interaction/absorption events by the resist material is the direct de-protection (direct cleaving of protecting groups that effect solubility during develop) of the polymer to allow the optimum level/threshold of de-protection to be driven to at the target feature edge to ensure optimum interaction with the develop solution (moving to the de-protection threshold of maximum develop contrast).

A third outcome of interaction/absorption events by the resist material is that de-protection events occur, which are exothermic reactions. This localized heating and free volume increase effect allows for localized control (acid trapping over time as the local heating diffuses). Before the local heating diffuses, significant acid mobility (and polymer mobility) in the local areas can occur for a short time. This increased mobility allows a significant number of acid events to happen on the protected polymer in a controlled/confined volume, which may lead to reduced roughness.

In another embodiment, the high power mid-UV flood system or module (secondary wavelength) is used to get interaction/absorption events with the PAG itself. Further PAG decomposition (from the mid-UV absorption event) will lead to potentially higher acid loading. This ability to shift the effective loading can lead to an optimum concentration, profile, or threshold being established at the target feature edge within the imaged resist, improving roughness as compared to just EUV patterning exposure. Another outcome from interaction/absorption events of the PAG is exothermic reactions. This localized heating and free volume increase effect allows for localized control (acid trapping over time as the local heating diffuses) but significant acid mobility (and polymer mobility) in the local area for a short time. This increased mobility allows a significant number of acid de-protection events to happen on the protected polymer in a controlled/confined volume, which could lead to reduced roughness.

In another embodiment, the high power mid-UV flood system or module (secondary wavelength) is used to get interaction/absorption events with the PDB itself. Further PDB decomposition (from the mid-UV absorption event) will lead to potentially lower base loading. This ability to shift the effective loading can lead to an optimum concentration, profile, or threshold being established at the target feature edge within the imaged resist, improving roughness as compared to just EUV patterning exposure. Another outcome from interaction/absorption events of the PDB is exothermic reactions. This localized heating and free volume increase effect allows for localized control (acid trapping over time as the local heating diffuses) but significant acid mobility (and polymer mobility) in the local area for a short time. This increased mobility allows significant number of acid de-protection events to happen on the protected polymer in a controlled/confined volume, which could lead to reduced roughness.

In another embodiment, the high power mid-UV flood system or module (secondary wavelength) is used to get interaction/absorption events with the PAG/PDB reaction intermediates and/or by-products. This could lead to selective photosensitization to cause further PAG/PDB decomposition. Further PAG and/or PDB decomposition (from the mid-UV interaction/absorption events with the by-products or intermediates) will lead to potentially higher acid loading, or lower base loading, or both. This ability to shift the effective loading in only the pattern exposed area given the intermediates and/or by-products are formed only in the exposed area can lead to an optimum concentration, profile, or threshold being established at the target feature edge within the imaged resist, improving roughness as compared to just EUV patterning exposure.

The light-sensitive layer may contain one or more onium salts, according to one embodiment. For example, the light-sensitive layer may include a PAG that contains an onium salt. The onium salt PAG film may contain acetal or thioacetal structures that may generate ketone derivatives during the EUV exposure, via an acid catalytic reaction, to enable an absorption shift in the PAG that leads to the selective photosensitization at the EUV exposed area. More specifically, the onium salt has no significant absorption in the ultraviolet while acid generated by EUV allows for a deprotected ketone of the onium salt to be formed due to the acetal or thioacetal presence. This deprotected ketone is converted to derivatives. The ketone derivative, having an absorption in the mid-UV flood system, then introduces interactions with other PAGs to form additional acid. The ketone derivative in the resist film, since it is generated in the exposed portion irradiated with EUV, allows the acid generation amount at the exposed portion by EUV to be increased by the high power mid-UV flood system. In an exemplary embodiment, the flood exposure uses energy at a wavelength greater than 360 nm, or between 360 nm and 400 nm, for absorption by the ketone derivative. The onium salts may include, but are not limited to, bromonium salts, oxonium salts, sulfonium salts, arsonium salts, ammonium salts, iodonium salts, and phosphonium salts.

The interaction/absorption events and localized heating and free volume increase effects are achieved without the need to incorporate PS and/or other light-absorbing elements such as chromophores in the resist chemistry. A conventional CAR chemistry may be used.

In one embodiment, a light-sensitive layer is formed on the substrate and a target resolution is defined for the pattern to be formed in a target layer on the substrate. Based on a reference dose and based on a reference line width roughness for the pattern that would result from a single patterning exposure using energy at a wavelength between 13 nm and 15 nm at the target resolution and reference dose, the light-sensitive layer is subjected to at least two exposures of radiative energy. The at least two exposures include a patterning exposure comprising the energy at the wavelength between 13 nm and 15 nm and a dose selected to be less than the reference dose and in a range of 15 mJ/cm$^2$ and 200 mJ/cm$^2$, and a flood exposure comprising energy at a wavelength between 200 nm and 420 nm and a dose between 0.5 J/cm$^2$ and 20 J/cm$^2$. The light-sensitive layer is then developed to form a mask pattern in the light-sensitive layer, and the substrate is etched using the mask pattern to form the pattern in the target layer on the substrate. The resulting pattern has the target resolution and a line width roughness that is less than or approximately equal to the reference line width roughness and less than or equal to 5 nm. By this method, an enabling throughput can be achieved with a decrease in EUV sensitivity and the same or better LWR and resolution, thereby overcoming the RLS triangle. The flood exposure can include a first flood exposure and a second flood exposure with at least one of the first or second flood exposures comprising the wavelength between 200 nm and 420 nm and the dose between 0.5 J/cm$^2$ and 20 J/cm$^2$. Alternatively, the flood exposure includes a single flood exposure before or after the EUV patterning exposure. Advantageously, the flood exposure is performed at least after the EUV patterning exposure, and before developing the resist. The method may further include a post-apply bake after the light-sensitive layer is formed on the substrate, but before exposing the substrate to the flood exposure or the patterning exposure. The method may further include a post-exposure bake after exposing the substrate to the patterning exposure, and in one embodiment, after all of the two or more exposures have been completed.

In another embodiment, a chemically-amplified resist (CAR) layer is formed on the substrate, wherein the CAR layer comprises a photo-acid generator (PAG), a photo-decomposable base (PDB), or both, and is free of addition of photosensitizer elements, and a target resolution is defined for the pattern to be formed in a target layer on the substrate. Based on a reference dose and based on a reference line width roughness for the pattern that would result from a single patterning exposure using energy at a wavelength between 13 nm and 15 nm at the target resolution and reference dose, the CAR layer is subjected to at least two exposures of radiative energy. The at least two exposures include a patterning exposure comprising the energy at the wavelength between 13 nm and 15 nm and a dose selected to be at least 3 mJ/cm$^2$ less than the reference dose and in a range of 20 mJ/cm$^2$ and 75 mJ/cm$^2$, and thereafter, a flood exposure comprising energy at a wavelength between 200 nm and 420 nm and a dose between 2 J/cm$^2$ and 12 J/cm$^2$. The CAR layer is then developed to form a mask pattern in the CAR layer and the substrate is etched using the mask pattern to form the pattern in the target layer on the substrate.

The resulting pattern has the target resolution and a line width roughness that is at least 0.1 nm less than the reference line width roughness and less than or equal to 5 nm.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method for forming a pattern on a substrate, comprising:
    forming a light-sensitive layer on the substrate;
    defining a target resolution for the pattern to be formed in a target layer on the substrate;
    based on a reference dose and on a reference line width roughness for the pattern that results from a single patterning exposure of the light-sensitive layer using energy at a wavelength between 13 nm and 15 nm at the target resolution and reference dose, exposing the light-sensitive layer to at least two exposures of radiative energy, the at least two exposures comprising:
        a patterning exposure comprising energy at the wavelength between 13 nm and 15 nm and a dose selected to be less than the reference dose and in a range of 15 mJ/cm$^2$ and 200 mJ/cm$^2$, and
        a flood exposure comprising energy at a wavelength between 200 nm and 420 nm and a dose between 0.5 J/cm$^2$ and 20 J/cm$^2$;
    developing the light-sensitive layer to form a mask pattern in the light-sensitive layer; and
    etching the substrate using the mask pattern to form the pattern in the target layer on the substrate, the pattern comprising the target resolution and a line width roughness that is less than or approximately equal to the reference line width roughness and less than or equal to 5 nm.

2. The method of claim 1, wherein the flood exposure comprises a first flood exposure and a second flood exposure with at least one of the first or second flood exposures comprising the wavelength between 200 nm and 420 nm and the dose between 0.5 J/cm$^2$ and 20 J/cm$^2$.

3. The method of claim 2, wherein the patterning exposure is performed between the first flood exposure and the second flood exposure.

4. The method of claim 1, wherein the patterning exposure is performed after the flood exposure.

5. The method of claim 1, wherein the patterning exposure is performed before the flood exposure.

6. The method of claim 1, wherein the flood exposure wavelength is between 360 nm and 400 nm.

7. The method of claim 1, wherein the flood exposure wavelength is 365 nm.

8. The method of claim 1, wherein the flood exposure dose is between 2 J/cm$^2$ and 12 J/cm$^2$.

9. The method of claim 1, wherein the flood exposure dose is between 3 J/cm$^2$ and 9 J/cm$^2$.

10. The method of claim 1, further comprising exposing the light-sensitive layer to a post-apply bake after the light-sensitive layer is formed on the substrate, but before exposing the substrate to the flood exposure or the patterning exposure.

11. The method of claim 1, further comprising exposing the light-sensitive layer to a post-exposure bake after exposing the substrate to the patterning exposure.

12. The method of claim 1, wherein the light-sensitive layer comprises a photo-acid generator (PAG), a photo-decomposable base (PDB), or both.

13. The method of claim 12, wherein the flood exposure enables selective photosensitization of the light-sensitive layer to increase decomposition of the PAG within the light-sensitive layer.

14. The method of claim 1, wherein the flood exposure enables a heating and free volume increase and increased acid mobility within a localized area within the light sensitive layer.

15. The method of claim 1, further comprising:
    forming a spin-on-carbon (SOC) layer on the substrate;
    forming a spin-on-glass (SOG) layer on the SOC layer,
    wherein the light-sensitive layer is formed on the SOG layer, and wherein the SOC layer is configured to limit reflections of radiative energy from the substrate at the wavelength of the flood exposure.

16. The method of claim 1, further comprising:
    forming one or more anti-reflective coating (ARC) layers on a substrate, the one or more ARC layers comprising an absorption layer tuned to absorb light at the wavelength of the flood exposure wherein the light-sensitive layer is formed on the one or more ARC layers.

17. The method of claim 1, wherein the light-sensitive layer comprises one or more onium salts including bromonium salts, oxonium salts, sulfonium salts, arsonium salts, ammonium salts, iodonium salts, or phosphonium salts.

18. The method of claim 1, wherein patterning exposure dose is selected to be at least 3 mJ/cm$^2$ less than the reference dose.

19. The method of claim 1, wherein the light-sensitive layer comprises a photo-acid generator (PAG) that includes one or more onium salts selected from bromonium salts, oxonium salts, sulfonium salts, arsonium salts, ammonium salts, iodonium salts, or phosphonium salts, and wherein the flood exposure comprises energy at a wavelength between 360 nm and 400 nm to enable selective photosensitization of the light-sensitive layer to increase decomposition of the PAG within the light-sensitive layer.

20. A method for forming a pattern on a substrate, comprising:
    forming a chemically-amplified resist (CAR) layer on the substrate, wherein the CAR layer comprises a photo-acid generator (PAG), a photo-decomposable base (PDB), or both, and is free of addition of photosensitizer elements;
    defining a target resolution for the pattern to be formed in a target layer on the substrate;
    based on a reference dose and on a reference line width roughness for the pattern that results from a single patterning exposure using energy at a wavelength between 13 nm and 15 nm at the target resolution and reference dose, exposing the CAR layer to at least two exposures of radiative energy, the at least two exposures comprising:
    a patterning exposure comprising the energy at the wavelength between 13 nm and 15 nm and a dose selected to be at least 3 mJ/cm$^2$ less than the reference dose and in a range of 20 mJ/cm$^2$ and 75 mJ/cm$^2$, and
    thereafter, a flood exposure comprising energy at a wavelength between 200 nm and 420 nm and a dose between 2 J/cm$^2$ and 12 J/cm$^2$;
    developing the CAR layer to form a mask pattern in the CAR layer; and
    etching the substrate using the mask pattern to form the pattern in the target layer on the substrate, the pattern comprising the target resolution and a line width roughness that is at least 0.1 nm less than the reference line width roughness and less than or equal to 5 nm.

21. The method of claim 20, further comprising:
forming one or more anti-reflective coating (ARC) layers on a substrate, the one or more ARC layers comprising an absorption layer tuned to absorb light at the wavelength of the flood exposure wherein the CAR layer is formed on the one or more ARC layers.

22. The method of claim 20, wherein the CAR layer comprises a PAG that includes one or more onium salts selected from bromonium salts, oxonium salts, sulfonium salts, arsonium salts, ammonium salts, iodonium salts, or phosphonium salts, and wherein the flood exposure comprises energy at a wavelength between 360 nm and 400 nm to enable selective photosensitization of the CAR layer to increase decomposition of the PAG within the CAR layer.

\* \* \* \* \*